US005568561A

United States Patent [19]
Whitlock

[11] Patent Number: 5,568,561
[45] Date of Patent: Oct. 22, 1996

[54] DIFFERENTIAL LINE RECEIVER WITH COMMON-MODE AC BOOTSTRAPPING

[76] Inventor: William E. Whitlock, 14604 La Cota Pl., Sherman Oaks, Calif. 91403

[21] Appl. No.: 363,243

[22] Filed: Dec. 22, 1994

Related U.S. Application Data

[63] Continuation of Ser. No. 50,905, Apr. 22, 1993, abandoned.
[51] Int. Cl.$^6$ ....................................... H03F 21/00
[52] U.S. Cl. ........................... 381/120; 330/258; 330/69
[58] Field of Search ........................... 381/120, 111–114; 330/258, 69

[56] References Cited

U.S. PATENT DOCUMENTS

| | | | |
|---|---|---|---|
| 3,453,554 | 7/1969 | Shoemaker | 330/30 |
| 4,047,122 | 9/1977 | Rao | 330/84 |
| 4,152,659 | 5/1979 | Gordon | 330/9 |
| 4,206,416 | 6/1980 | Kellogg | 330/69 |
| 4,242,741 | 12/1980 | Parrish | 367/21 |
| 4,320,351 | 3/1982 | Brown, Jr. et al. | 330/260 |
| 4,525,677 | 6/1985 | Rorden | 330/258 |
| 4,567,608 | 1/1986 | Watson et al. | 381/111 |
| 4,679,002 | 7/1987 | Sherwin et al. | 330/66 |
| 4,742,309 | 5/1988 | Chu | 330/258 |
| 4,979,218 | 12/1990 | Strahm | 381/94 |
| 5,032,797 | 7/1991 | Mijuskovic | 330/253 |
| 5,043,674 | 8/1991 | Bonaccio et al. | 330/257 |
| 5,095,282 | 3/1992 | Dayton | 330/69 |
| 5,300,896 | 4/1994 | Suesserman | 330/260 |

OTHER PUBLICATIONS

Radio Shack, "Linear Applications," vol. 1, National, May 1968, AN5-1, AN5-9, AN5-10.
Millman et al., "Integrated Electronics: Analog and Digital Circuits and Systems," 1972, pp. 276–278.

*Primary Examiner*—Curtis Kuntz
*Assistant Examiner*—Ping W. Lee
*Attorney, Agent, or Firm*—Pretty, Schroeder, Brueggemann & Clark

[57] ABSTRACT

A bootstrapped audio line receiver that receives a differential-mode input signal from first and second differential lines and outputs a single-ended signal on an output line. The line receiver includes a differential amplifier and an input amplifier having differential output terminals and differential input terminals. The input amplifier is connected between the differential lines and the differential amplifier. The input amplifier provides a dc current path to a ground terminal while maintaining a high input impedance to ac signals at audio frequencies. The input amplifier also includes an rf filter that removes rf noise without adversely affecting the line receiver's common-mode noise rejection at audio frequencies. In one embodiment, the input amplifier includes two operational amplifiers connected for unity gain and having two bias resistors connected in series between each input terminals of the input amplifier and a ground terminal. A capacitor is connected from the output of each operational amplifier to a node between each set of series connected bias resistors and prevents the low impedance of the bias resistors from significantly degrading the line receiver's common-mode rejection ratio. Thus, the line receiver tolerates a wide range of balanced and unbalanced source impedances with a minimal deterioration of the line receiver's common-mode rejection ratio.

19 Claims, 4 Drawing Sheets

FIG. 5 PRIOR ART
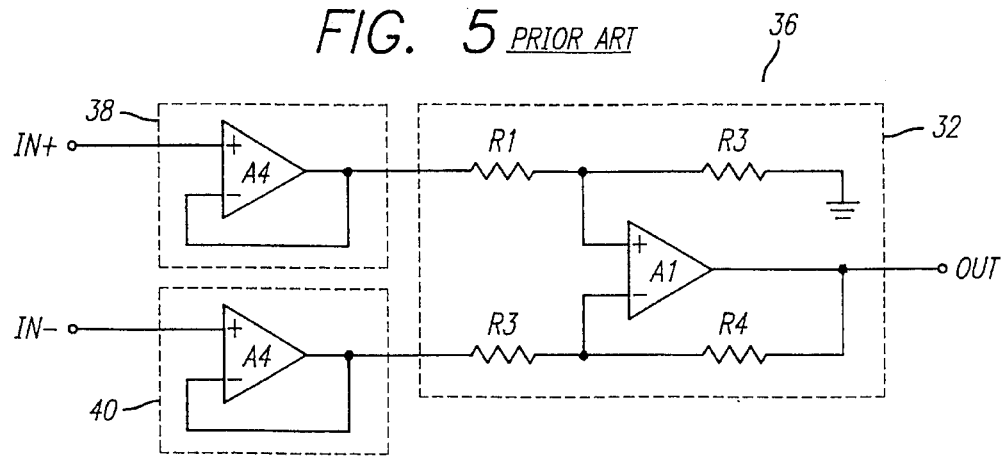
FIG. 6 PRIOR ART
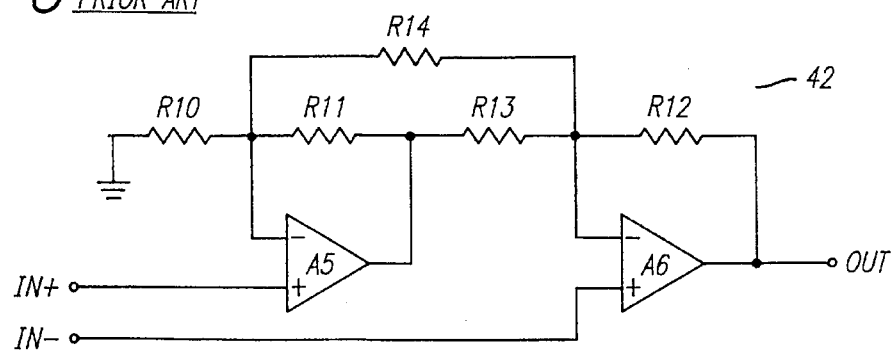
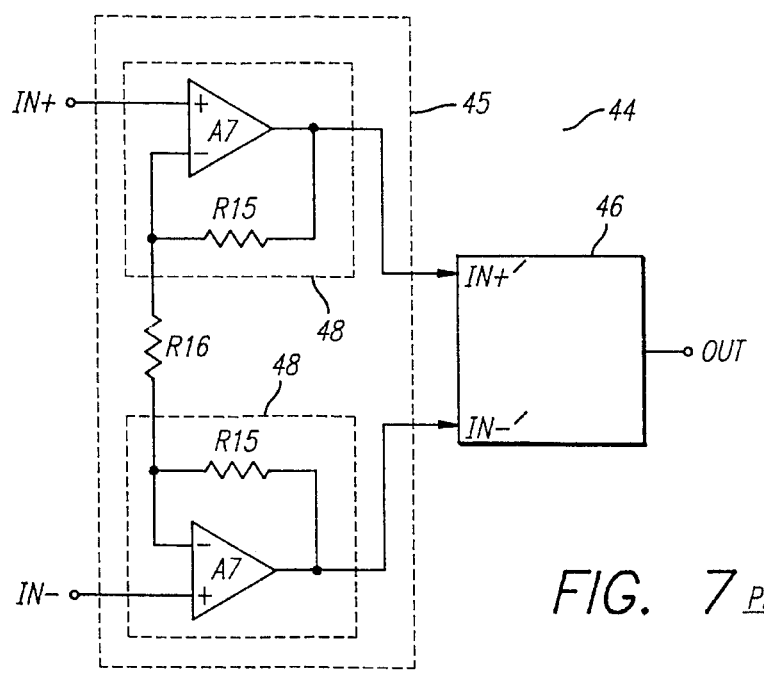
FIG. 7 PRIOR ART

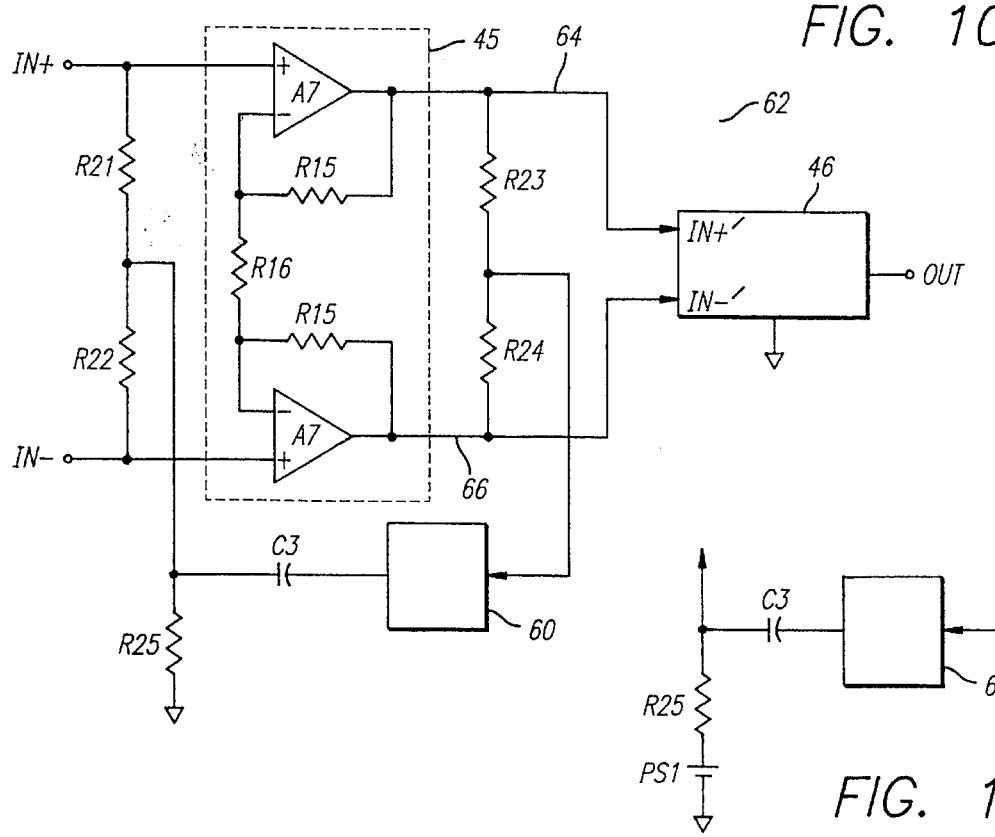
FIG. 10
FIG. 11
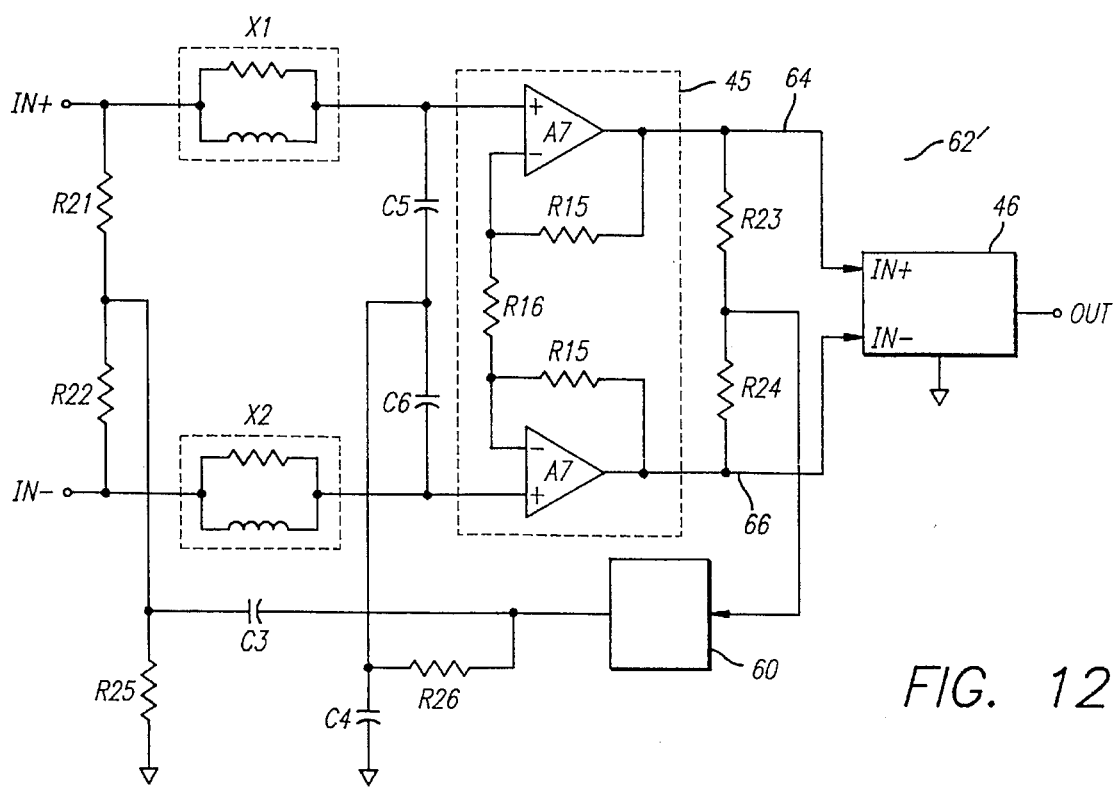
FIG. 12

DIFFERENTIAL LINE RECEIVER WITH COMMON-MODE AC BOOTSTRAPPING

CROSS-REFERENCE TO RELATED APPLICATIONS

This is a Continuation-in-part of International Application PCT/US94/04424, with an international filing date of Apr. 22, 1994, now abandoned, which is a continuation of U.S. application Ser. No. 08/050,905, filed Apr. 22, 1993, now abandoned.

BACKGROUND OF THE INVENTION

The present invention relates generally to the transfer of audio signals between electronic devices. More particularly, the invention relates to a line receiver circuit that reduces the amount of noise introduced into an audio signal as the signal is transferred between physically separated electronic devices.

An audio system typically includes a combination of electronic devices such as preamplifiers, mixers, power amplifiers, etc. In an audio system designed for a large listening audience such as in a convention hall, theater, or building, such electronic devices might be physically separated by large distances and powered by different ac power line circuits. The different ac power line circuits can introduce significant undesired noise to the audio signal.

Each ac power line circuit has its own local ground reference. The capacitance between the ac power line and the chassis of each electronic device can induce a voltage at the local ground of the chassis. Thus, a considerable voltage difference can arise between the local grounds of the various electronic devices of the audio system. This voltage difference causes a current to flow in any conductor that interconnects electronic devices connected to different ac power line circuits. These currents that flow through the conductor between the electronic devices are often rich in harmonics of the power line frequency, which is typically 50 to 60 hertz. These harmonics of the power line frequency are heard as a distracting hum or buzz, if reproduced by the audio system.

With reference to FIG. 1, a prior art audio system 10 is shown to include a driving device 12 and a receiving device 14. An audio signal Vs is transmitted from the driving device to the receiving device over a cable 16 that includes a conductor pair having first and second differential lines 18 and 20, respectively. The cable may also include a shield 21 that surrounds the first and second differential lines. Typically the shield is connected to the local ground 24 of the driving device. The audio signal Vs is transmitted in a differential mode, which means that the audio signal is represented by the difference in voltage between the differential lines 18 and 20 irrespective of any local ground reference. The driving device has a source impedance associated with its positive and negative output designated Rs+ and Rs–, respectively. The receiving device includes a line receiver 22 which has an input impedance associated with its positive and negative input terminals, designated IN+ and IN–, respectively.

The noise voltage Vn caused by the voltage difference between the local grounds 24 and 26 of the respective driving device 12 and receiving device 14 is presented simultaneously to both input terminals IN+ and IN– of the line receiver 22. This noise voltage Vn is commonly referred to as a common-mode voltage. A common-mode voltage is a voltage referenced to the local ground of the receiving device that is present at both input terminals IN+ and IN– of the line receiver 22. The common-mode noise voltage Vn contains the undesired harmonics of the power line frequency and it is very desirable for the receiving device to reject such common-mode voltage signals.

As shown in FIG. 2, one method for the line receiver 22' to reject the common-mode voltage signals is to use a transformer T1 coupled to the inputs of the receiving device 14. The common-mode noise voltage, which is applied simultaneously to both inputs IN+ and IN– of the primary winding 28, is not transmitted from the primary winding to the secondary winding 30 of the transformer, but the differential-mode audio signal is transmitted. Accordingly, the amplifier 31 receives only the differential-made audio signal. Although the transformer therefore is effective in eliminating common-mode noise voltage, Vn, it has cost, size, and weight disadvantages that limit its widespread use.

With reference to FIG. 3, a simple voltage-mode differential amplifier circuit 32 has been used in the past as a line receiver that eliminates common-mode noise without using a transformer. The circuit 32 includes an operational amplifier A1 and four gain/bias resistors R1, R2, R3 and R4. The circuit 32 has two input terminals IN+ and IN– and an output terminal OUT. The voltage gain for voltage signals applied to the input terminal IN– is –R4/R2. The voltage gain for voltage signals applied to the input terminal IN+ is [(R2+R4)/R2] [R3/(R1+R3)]. By setting R1 equal to R2 and R3 equal to R4, the voltage gain for voltage signals applied to the input terminal IN+ becomes R4/R2. The voltage gain for common-mode voltage signals is found by summing the voltage gain of the two inputs together. Thus, the gain of the differential amplifier circuit 32 for common-mode voltage signals is zero, if resistors R1 and R3 are matched to resistors R2 and R4 respectively, since (R4/R2)+(–R4/R2)= 0. Thus, by carefully matching the resistor values, any common-mode voltages at the input terminals IN+ and IN– are substantially rejected.

In actual practice, the resistors R1 and R2 and the resistors R3 and R4 are never perfectly matched, and the rejection of common-mode voltage signals is quantified as the common-mode rejection ratio (CMRR). The CMRR of a differential amplifier circuit is defined as the gain of differential-mode signals divided by the gain of common-mode signals. In addition, the effects of the output impedances Rs+ and Rs– of the driving device 12 which have not yet been discussed, can adversely affect CMRR.

With reference now to FIG. 4, a simple current-mode differential amplifier circuit 34 also has been used in the past as a line receiver that eliminates common-mode noise without using a transformer. The circuit 34 includes two operational amplifiers A2 and A3, and five gain/bias resistors R5, R6, R7, R8 and R9. Like the voltage-mode circuit discussed above, this circuit has two input terminals IN+ and IN– and an output terminal OUT. The inverting terminal of the operational amplifier A3 acts as a current summing node at virtual ground. The current through the resistors R7 and R8 is determined by the classic ohm's law formula I=V/R. The current through the resistor R9 is merely the negative sum of the currents through the resistors R7 and R8. To have the amplifier operate in a differential mode, one input, in this case the input associated with the resistor R7, is inverted by the inverting amplifier configuration of the resistors R5 and R6 and the operational amplifier A2.

The resistor pair R5 and R6 and the resistor pair R7 and R8 should be matched to obtain a large CMRR. In actual practice, the resistor pair R5 and R6 and the resistor pair R7 and R8 are never perfectly matched, which results in a finite CMRR as discussed above with respect to the voltage-mode differential amplifier.

The differential amplifier circuits 32 and 34 shown in FIGS. 3 and 4 offer good common-mode voltage rejection only if the source impedances Rs+ and Rs− of the driving device 12 are very closely matched. If the source impedances are not closely matched, the circuit's CMRR degrades significantly. The CMRR degrades because these circuits have relatively low common-mode input impedances at their two input terminals IN+ and IN−. These low input impedances are in series with the source impedances. If the source impedances are not exactly equal, an unequal voltage division of the audio signal occurs at the input terminals IN+ and IN−. For example, in practical application of the circuits 32 and 34 shown in FIGS. 3 and 4, a source impedance imbalance of only 5 ohms will degrade the CMRR from 80 db to 40 db.

With reference now to FIG. 5, a more complex instrumentation amplifier circuit 36 can substantially eliminate the sensitivity of the simple differential amplifier circuits 32 and 34 to unbalanced source impedances of the driving device 12. The instrumentation amplifier circuit 36 has two input buffers 38 and 40 connected to the respective inputs of the differential amplifier, shown here as a voltage-mode differential amplifier 32. Each input buffer is typically an operational amplifier A4 configured for unity gain. The large input impedance of the operational amplifier reduces to negligible levels the voltage division effects caused by the source impedance. The output impedance of the operational amplifier is very small and does not vary significantly over a large range of output current levels. Thus, the input buffers 38 and 40 prevent the unbalanced source impedances of a driving device from reducing the CMRR of the differential amplifiers 32 and 34.

An instrumentation amplifier 42 shown in FIG. 6, is known to eliminate common-mode noise. The amplifier includes two operational amplifiers A5 and A6 and five gain/bias resistors R10, R11, R12, R13 and R14. By matching the gain/bias resistors, the circuit exhibits unity gain for differential-mode signals and zero gain for common-mode signals. However, as mentioned above, the gain/bias resistors are never perfectly matched and the amplifier exhibits a finite CMRR.

An improved instrumentation amplifier 44, shown in FIG. 7, also is known to improve the performance of a simple differential amplifier 46, such as the differential amplifiers 32 and 34 shown in FIGS. 3 and 4, respectively. The instrumentation amplifier has a differential-gain stage 45 between the input terminals IN+ and IN− of the instrumentation amplifier and the input terminals IN+' and IN−' of the differential amplifier 46. The differential-gain stage includes two identical circuits 48, each circuit including an operational amplifier A7 and a bias/gain resistor R15, and each connected to a separate input terminal. The noninverting input of one operational amplifier A7 is connected to the input terminal IN+, and the noninverting input of the other operational amplifier A7 is connected to the input terminal IN−. A resistor R15 is connected between the noninverting input and the output of each amplifier A7, and a resistor R16 is connected between the inverting inputs of the two operational amplifiers. The outputs of the two operational amplifiers A7 are connected to the respective inputs IN+' and IN−' of the differential amplifier 46. The differential amplifier 46 may take the form of either the voltage-mode differential amplifier 32 shown in FIG. 3 or the current-mode differential amplifier 34 shown in FIG. 4.

The differential-gain stage amplifies differential mode signals by a factor equal to $(2R15+R16)/R16$ and amplifies common-mode signals by unity. Thus, the differential amplifier 46 receives a signal in which the common-mode signal has already been suppressed by a factor of $(2R15+R16)/R16$, thereby improving the CMRR of the instrumentation amplifier 44 over that of the simple differential amplifier.

However, each of the instrumentation amplifier circuits 36, 42 and 44 shown in FIGS. 5, 6 and 7, respectively, has a serious practical problem when used as a line receiver in an audio system, because the inputs of the operational amplifiers may have no external dc paths for their bias currents. Such dc bias currents are necessary for the operational amplifiers to function properly. Since the signal sources of an audio system are often ac coupled, they cannot be relied upon to provide the dc path. In addition, using a resistor connected to a local ground terminal to provide the dc path will degrade the CMRR of these instrument amplifier circuits by lowering the input impedance of each input buffer.

It should therefore be appreciated that there is the need for amplifier circuits that, when used as a differential audio line receiver, provide a very large common-mode input impedance while at the same time providing a dc path for the bias currents of the operational amplifiers. The present invention fulfills this need.

SUMMARY OF THE INVENTION

The present invention is embodied in an audio line receiver that receives differential-mode audio signals transmitted between physically separated electronic devices. The audio line receiver is tolerant of a wide range of real world balanced and unbalanced source impedances with only a minimal deterioration of the receiver's common-mode rejection ratio.

More particularly, the audio line receiver receives a differential-mode input signal from first and second differential lines and provides an output signal on an output line. The input signal is represented by the voltage difference between the first and second differential lines irrespective of any ground reference while the output signal is represented by the difference between the output line and a local ground reference. The audio line receiver includes a differential amplifier and an input amplifier. The differential amplifier has first and second input terminals and an output terminal and the input amplifier has first and second input terminals and first and second output terminals. The output terminals of the input amplifier are connected the input terminals, respectively, of the differential amplifier. The differential amplifier has its output terminal connected to the output line. The input amplifier has its input terminals connected directly to the first and second differential lines, respectively, and also maintains a high input impedance for ac signals above a first predetermined frequency while providing a dc current path to accommodate a bias current at the input terminals of the input amplifier. The dc bias currents allows the input amplifier to function properly. The large ac input impedance of the input amplifier allows the differential amplifier to reject common-mode signals over a wide range of unbalanced source impedances. Thus, the line receiver receives differential mode audio signals while substantially rejecting common-mode signals above the first predetermined frequency.

In one embodiment of the invention, the input amplifier includes first and second operational amplifiers, each having an output terminal, an inverting input terminal and an non-inverting terminal. Each operational amplifier is configured in a unity gain configuration having its output terminal connected directly to its inverting input terminal. Each operational amplifier has its noninverting input terminal and output terminal connected to the respective input and output terminal, of the input amplifier. The first and second bias resistors are coupled in series between the first input terminal of the input amplifier and a ground terminal, and third and fourth bias resistors are coupled in series between the second input terminal of the input amplifier and the ground terminal to provide a dc current path from the first and second input terminals to the ground terminal. A first capacitor is connected between the first input terminal of the input amplifier and a node between the first and second bias resistors and a second capacitor and the second input terminal of the input amplifier. Each capacitor is sized such that above the first predetermined frequency, the magnitude of its impedance is less than the magnitude of the resistance of the first and second bias resistors.

The typical line frequency is 60 Hz, which is higher than the lowest audible frequency of the audio signal. The first predetermined frequency is chosen such that all the differential mode audio signals frequencies are received while the common-mode line frequencies and harmonics are substantially rejected.

In more detailed feature of the invention, the first predetermined frequency is chosen to be about 0.1 hertz (Hz). Such a frequency can be achieved by sizing first and second bias resistors to have resistances of about 25 kilohms and by sizing a capacitor to have a capacitance of about 65 microfarads. Another desired embodiment of the invention achieves a similar performance by sizing first and second bias resistors to have a resistance of about 10 kilohms and by sizing a capacitor having a capacitance of about 100 microfarads.

In another embodiment of the invention, the input amplifier can be a differential-mode gain stage typical of an instrumentation amplifier. The gain stage includes first and second operational amplifiers and first, second, and third gain resistors. The first and second operational amplifiers each has an output terminal, an inverting input terminal, and a noninverting input terminal. The noninverting input terminals of the first and second operational amplifiers are connected to the first and second input terminals, respectively, of the input amplifier and the output terminals of the first and second operational amplifiers being connected to the first and second output terminals, respectively, of the input amplifier.

The first gain resistor is connected between the output and the inverting input of the first operational amplifier, the second gain resistor is connected between the output and the inverting input of the second operational amplifier, and the third gain resistor is connected between the inverting inputs of the first and second operational amplifiers. The input amplifier also includes first and second bias resistors that are connected in series between the first and second input terminals of the input amplifier. A third bias resistor is connected between the ground terminal and the node between the first and second bias resistors to provide the dc current path from the first and second input terminals of the input amplifier to the ground terminal. Also included in the input amplifier are fourth and fifth bias resistors, a unity-gain amplifier and a feedback capacitor. The fourth and fifth bias resistors are coupled in series between the first and second output terminals of the amplifier. The unity-gain amplifier has an input terminal. The output terminal and the input terminal of the unity-gain amplifier is connected to a node between the fourth and fifth bias resistors and the feedback capacitor is connected between the output terminal of the unity-gain amplifier and the node between the first, second and third bias resistors. The feedback capacitor is sized to have an impedance less than the resistance of the third bias resistor at frequencies above the first predetermined frequency.

In a more detailed feature of the invention, a power supply is connected between the third bias resistor and the ground terminal. The power supply provides electrical power at the first and second differential input through the first, second and third bias resistors. This electrical power can be used to power a device (for example, a professional microphone) coupled to the first and second differential input terminals.

In another more detailed feature of the invention, the unity-gain amplifier is an operational amplifier configured for unity gain by having its inverting input terminal directly connected to its output terminal. A signal at the noninverting input terminal of the unity-gain amplifier is amplified by unity-gain and provided at the output terminal.

In yet another embodiment of the invention, the differential-mode gain stage, discussed above, is modified to further include a low-pass filter having first and second series elements and first and second shunt elements. The first series element has one end connected to the first differential input terminal and its other end connected to one end of the first shunt element. The first shunt element has its other end coupled to the ground terminal through a portion of the gain-stage amplifier that effectively couples the shunt elements to the ground terminal only at frequencies above a second predetermined frequency. Likewise, the second series element has one end connected to the second differential input terminal and its other end connected to one end of the second shunt element. Also, the second shunt element has its other end coupled to the ground terminal through the portion of the gain-stage amplifier that effectively couples the shunt elements to the ground terminal only at frequencies above a second predetermined frequency. The second predetermined frequency is higher than the first predetermined frequency so that the line receiver receives the differential-mode signal at frequencies between the first and second predetermined frequencies and substantially rejects undesired signals having a frequency above the second predetermined frequency. Preferably, the first predetermined frequency is approximately 0.1 hertz and the second predetermined frequency is approximately 300 kilohertz.

More specifically, the first and second filter elements each have an ac impedance that is generally greater than or equal to its respective dc resistance and each is connected between the noninverting input terminal of the first and second operational amplifiers, respectively, and the first and second differential input terminals, respectively.

The first and second shunt elements include first and second filter capacitors connected in series between the noninverting input terminals of the first and second operational amplifiers. Low-pass filter also includes a filter resistor connected between the output terminal of the unity-gain amplifier and a node between the first and second filter capacitors, and a third filter capacitor connected between the node between the first and second filter capacitors and the ground terminal. The third filter capacitor is sized to have an impedance less than the resistance of the filter resistor at frequencies above the second predetermined frequency.

Other features and advantages of the present invention should become apparent from the following description of the preferred embodiment, taken in conjunction with the accompanying drawings, which illustrate, by way of example, the principles of the invention.

BRIEF DESCRIPTION OF THE DRAWINGS

FIG. 5 is a schematic diagram of a prior art differential amplifier having buffered inputs.

FIG. 6 is a schematic diagram of a simple current-mode differential amplifier of the prior art.

FIG. 7 is a schematic diagram of a prior art instrumental amplifier.

FIG. 10 is a schematic diagram of a third embodiment of a differential audio line receiver of the present invention.

FIG. 11 is a schematic diagram of a portion of the line receiver shown in FIG. 10, additionally including a "phantom" power supply.

FIG. 12 is a schematic diagram of a fourth embodiment of a differential audio line receiver of the present invention having a high frequency filter.

DESCRIPTION OF THE PREFERRED EMBODIMENTS

Figure 1:
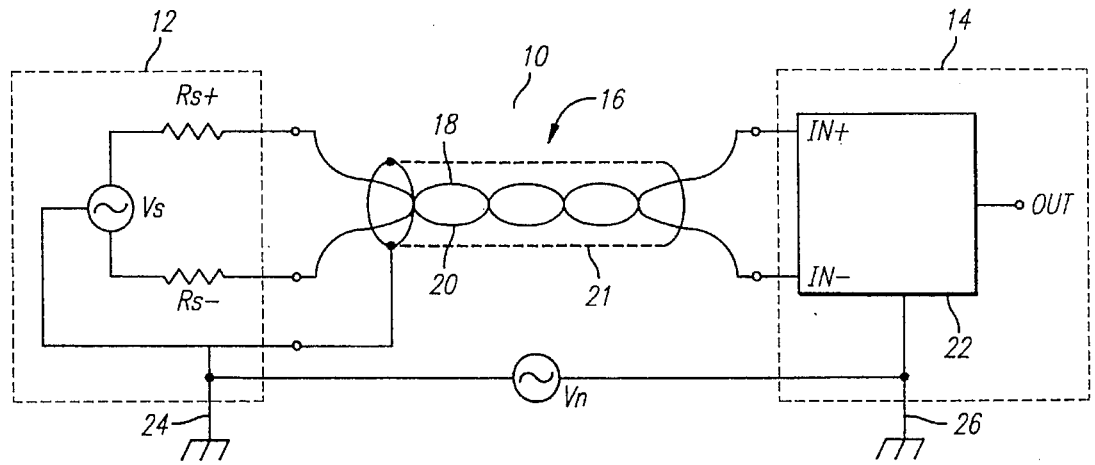
FIG. 1 is a schematic diagram of an audio system having physically separated electronic devices.
Figure 2:
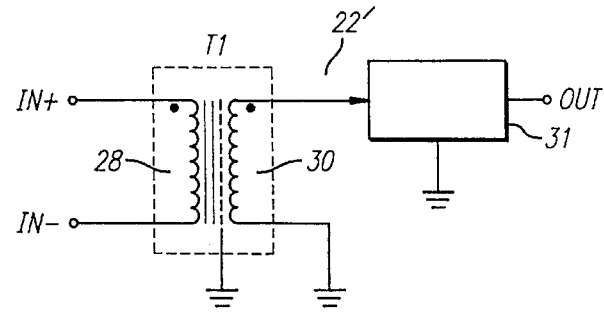
FIG. 2 is a schematic diagram of a transformer coupled differential receiver of the prior art.
Figure 3:
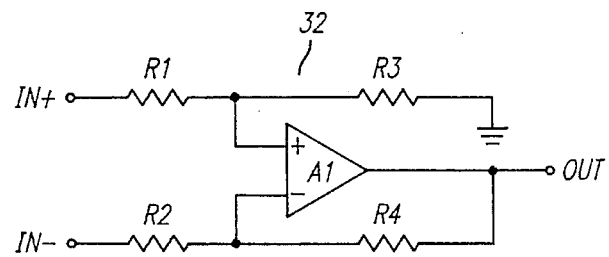
FIG. 3 is a schematic diagram of a simple voltage-mode differential amplifier of the prior art.
Figure 4:
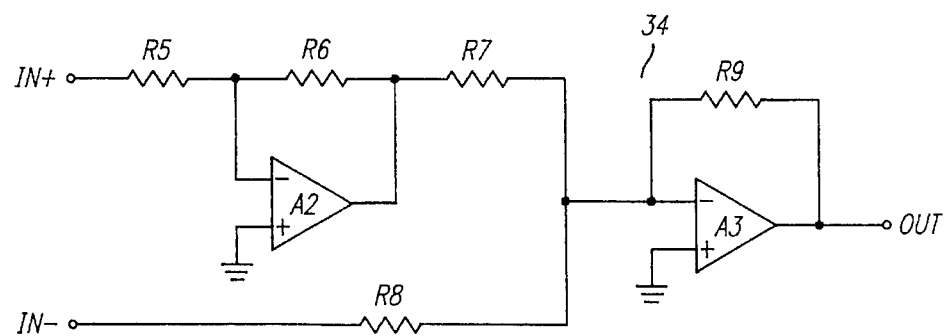
FIG. 4 is a schematic diagram of a simple current-mode differential amplifier of the prior art.
Figure 8:
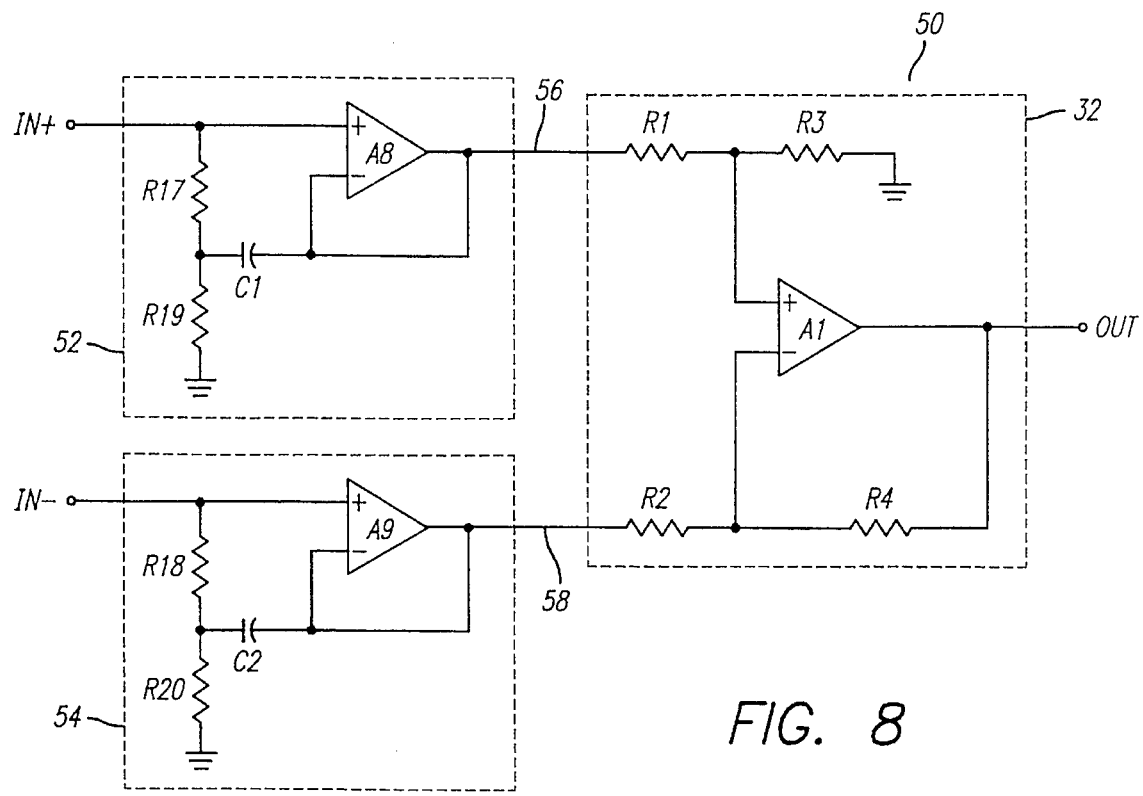
FIG. 8 is a schematic diagram of a differential line receiver embodying the present invention.

FIG. 8 shows an embodiment of the differential audio line receiver 50 in accordance with the present invention, for receiving audio signals from a driving device 12. The line receiver includes a differential amplifier 32 and two input amplifiers 52 and 54. The differential amplifier 32, which combines an operational amplifier A1 and resistors R1, R2, R3 and R4, corresponds to the prior art differential amplifier 32 of FIG. 2. The differential amplifier includes a noninverting input terminal 56, an inverting input terminal 58, and an output terminal OUT, and it operates in the manner described above in the Background of the Invention above. The preferred resistance value for resistors R1, R2, R3 and R4 is 25K.

The input amplifiers 52 and 54 each have an input terminal IN+ and IN−, respectively, and each have an output terminal. The output terminal of the first input amplifier 52 is connected to the noninverting input terminal 56 of the differential amplifier 32, and the output terminal of the second input amplifier 54 is connected to the inverting input terminal 58 of the differential amplifier 32.

The first input amplifier 52 includes an operational amplifier A8, two biasing resistors R17 and R19 and a coupling capacitor C1. The bias resistors R17 and R19 are connected in series between the noninverting input terminal of the operational amplifier A8 and a signal ground terminal. The noninverting input terminal of the operational amplifier A8 serves as the input terminal IN+ of the input amplifier 52. The inverting input terminal of the operational amplifier A8 is connected directly to the output terminal of the operational amplifier A8. Thus, the bias resistors R17 and R19 provide a dc current path to ground for the noninverting input of the operational amplifier A8. The coupling capacitor C1 prevents the bias resistors R17 and R19 from lowering the input impedance of the input amplifier 52, which would reduce the common-mode rejection ratio (CMRR) of the line receiver 50.

By connecting the coupling capacitor C1 from the inverting input terminal of the operational amplifier A8 to the node between resistors R17 and R19, the resistor R17 can be made effectively to have a very large impedance at frequencies above a predetermined cutoff frequency. The predetermined cutoff frequency is the frequency at which the impedance of coupling capacitor C1 is equal to the resistance of the resistor R19. At frequencies substantially above this cutoff frequency, the node between resistors R17 and R19 is thereby effectively shorted to the inverting input terminal of the operational amplifier A81. The operational amplifier A8 causes the same voltage to appear at both ends of the resistor R17, so that substantially no ac current flows through the resistor R17 at such frequencies. Accordingly, the substantially reduced current flow through the resistor R17 causes the effective resistance of the resistor R17 to be much larger than its actual or dc value. Thus, the input amplifier 52 provides a very high effective input impedance at frequencies substantially above the predetermined cutoff frequency.

In a similar manner, the second input amplifier 54 includes an operational amplifier A9, bias resistors R18 and R20, and a coupling capacitor C2 that effectively isolates the inverting input terminal 58 of the differential amplifier 32.

The cutoff frequency must be low enough so that the common-mode input impedance of line receiver 50 is sufficiently high over all frequencies of interest for rejection of undesired common-mode noise. Such a line receiver 50 having a sufficiently low cut-off frequency will exhibit a gain that is sufficiently constant over all frequencies of interest in the audio signal. However, the cutoff frequency must be large enough to be readily implemented using standard available components. To eliminate low-frequency common-mode noise voltages including the power line frequency of 50 or 60 Hz, and harmonics of that frequency, the cutoff frequency defined by the combination of the capacitor C1 and the resistor R19 and of the combination of the capacitor C2 and the resistor R20, at the input amplifiers 52 and 54 preferably is selected to be about 0.1 Hz. Such a cutoff frequency can be achieved using resistance values for the resistors R17, R18, R19 and R20 of about 25 kilohms and capacitance values for the capacitors C1 and C2 of about 65 microfarads. A desirable cutoff frequency of 0.16 Hz is achieved using resistance values for R17, R18, R19 and R20 of about 10 kilohms and capacitance values for the capacitors C1 and C2 of about 100 microfarads.

The output impedance of each of the input amplifiers 52 and 54 is substantially uniform over a wide range of signal levels. The high effective input impedance and the low output impedance of the input amplifiers 52 and 54 reduces the voltage division effects caused by imbalances between the sources impedances Rs+ and Rs− and effectively isolates or buffers the inputs of the differential amplifier 32 from the source impedances Rs+ and Rs− of the driving device 12. Thus, the line receiver 50 can receive audio signals from a wide variety of electronic audio equipment having any combination of ac- or dc-coupled outputs and wide range of balanced or unbalanced source impedances with a minimal deterioration of the rejection of common-mode voltage signals. Since the line receiver can receive either ac-coupled or dc-coupled outputs, no coupling capacitors are needed on the input terminals IN+ and IN− of the line receiver. This is advantageous since unmatched coupling capacitors would tend to aggravate the source impedance problem and matched coupling capacitors, if obtainable, would increase the cost of the line receiver.

Figure 9:
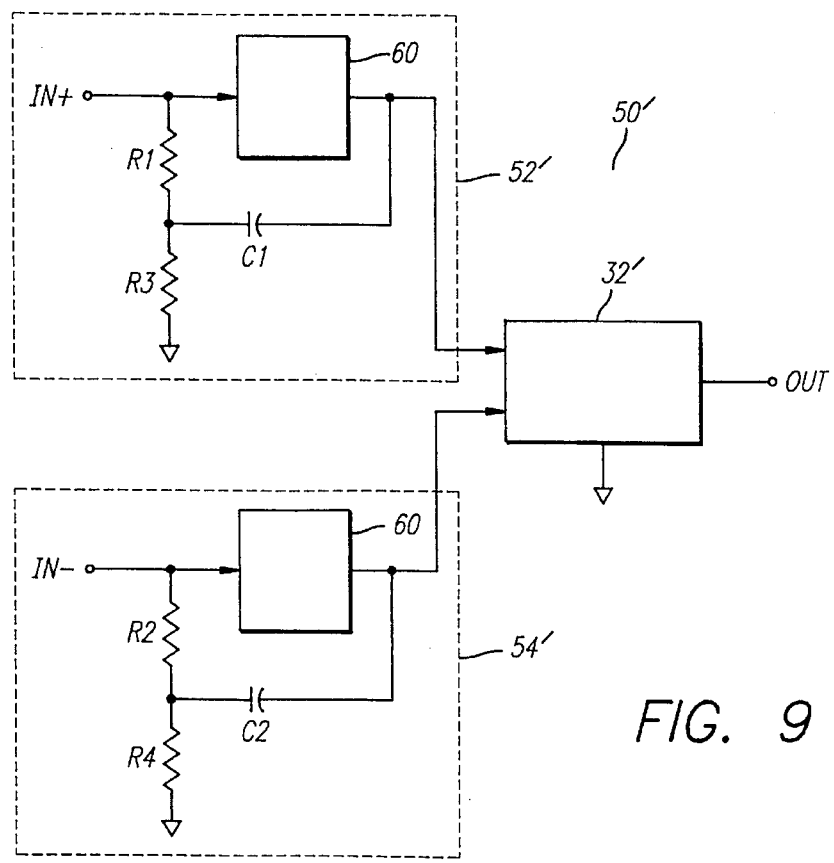
FIG. 9 is a schematic diagram of a second more general embodiment of the differential audio line receiver shown in FIG. 8.

The line receiver 50 of the present invention is more general than the specific embodiment shown in FIG. 8. Another embodiment of the line receiver 50', shown in FIG. 9, indicates that the differential amplifier 32 of FIG. 8 may be replaced with many types of differential amplifiers 32', such as the simple differential amplifier 34 or the instrumentation amplifier 44 discussed above. Also, the input amplifiers 52 and 54 of FIG. 8 need not be limited to the unity-gain operational amplifiers A8 and A9. Instead, the unity-gain operational amplifiers may be replaced with most any type of unity-gain amplifier 60 as shown in FIG. 9. Each unity gain amplifier 60 need only have the characteristics of approximately unity-gain, a relatively high input impedance, and a relatively low output impedance. Accordingly, each unity-gain amplifier 60 may be constructed using a combination of operational amplifiers, discrete semiconductors, vacuum tubes, etc.

An alternative embodiment of the present invention is the differential audio line receiver 62 shown in FIG. 10. This line receiver is a modification to the instrumentation amplifier 44 of FIG. 7. In the line receiver, two resistors R21 and R22 are connected in series between the input terminals IN+ and IN− and two resistors R23 and R24 are connected in series between the output terminals 64 and 66 of the differential-gain stage 45. A resistor 25 is connected between a ground terminal and the node between the two resistors R23 and R24 to provide a dc bias current path for the inputs IN+ and IN−.

A unity-gain amplifier 60 and a capacitor C3, connected in series with the unity-gain amplifier, are connected between the node between the resistors R23 and R24 and the node between the resistors R21, R22 and R25. As mentioned before, the common-mode gain of the differential-gain stage 45 is essentially unity while the differential-mode gain of the differential-gain stage is very high. The common-mode output of the differential gain stage is coupled through the resistors R23 and R24, to the unity gain amplifier 60. Through the capacitor C3, the unity-gain amplifier, drives the node between the resistors R21, R22, and R25 with the buffered common-mode signal which causes both resistors R21 and R22 to exhibit a high ac impedance to common-mode signals, while also providing a dc bias path through resistor R25. Note that the embodiment of the line receiver 62 shown in FIG. 10 requires only one unity-gain amplifier.

As shown In FIG. 11, the line receiver 62 of FIG. 10 is readily suitable as a low signal-level preamplifier modified for use with a professional microphone, such as those for low impedance microphones, which typically is powered by a "phantom" power supply. A "phantom" power supply is provided to a microphone connected to the inputs IN+ and IN− of the line receiver by connecting the resistor R25 to the "phantom" power supply PS1 instead of to a ground terminal. The resistors R21, R22 and R25 will provide a current path for the required power supply and dc bias currents, while exhibiting a very high impedance at audio frequencies. Accordingly, the line receiver will eliminate source impedance effects that can degrade the CMRR of the amplifier at audio frequencies.

Another embodiment of a differential audio line receiver 62' of the present invention is shown in FIG. 12. The line receiver 62' includes a bootstrapped low-pass rf filter that improves the high-frequency common-mode rejection capabilities of the line receiver 62 shown in FIG. 10.

More specifically, the line receiver 62' includes first and second series filter elements X1 and X2, with the first series filter element connected between the positive input terminal IN+ and the noninverting input terminal of one operational amplifier A7, and the second series filter element connected between the negative input terminal IN− and the noninverting input terminal of the other operational amplifier A7. The first and second series filter elements can be a resistor, an inductor, a common-mode inductor, or any combination of these elements. The line receiver further includes first and second filter capacitors C5 and C6 which are connected in series between the noninverting input terminals of the operational amplifiers. A third filter capacitor C4 is connected between the node between the first and second filter capacitors and the ground terminal. A filter resistor R26 is connected between the output of the unity gain amplifier 60 and the node between the first, second, and third filter capacitors.

The filter resistor R26 and the third filter capacitor C4 form a low-pass filter preferably having a cutoff frequency of about 300 KHz. Therefore, at frequencies below the cutoff frequency, the node between the first and second filter capacitors C5 and C6 is bootstrapped such that no ac current flows through the first and second filter capacitors thereby removing their effect on the line receiver's CMRR at audio frequencies. However, above the cutoff frequency, the third filter capacitor provides a sufficient path to ground for the first and second filter capacitors C5 and C6 and the first and second series filter elements X1 and X2 to act as a low-pass filter to prevent radio-frequency signals from reaching the operational amplifiers A7.

Thus, the line receiver provides good common-mode noise rejection over the entire audio frequency range while also rejecting rf noise. Preferably, the resistors R21 and R22 have a matched resistance of 10 kilohms, the resistors R23 and R24 have a matched resistance of 5 kilohms, the gain resistors R15 have a matched resistance of 10 kilohms, the resistors 23 and 24 have matched resistance of 5 kilohms, the filter capacitors C5 and C6 have a matched capacitance of 47 picofarads, and the first and second filter elements X1 and X2 have a matched resistance of 47 kilohms in parallel with a matched inductance of 20 millihenries. The other passive components do not need to be matched and preferably the third gain resistor has a resistance of 1 kilohm, the resistor R25 has a resistance of 10 kilohms, the filter capacitor C4 has a capacitance of 470 picofarads, the filter resistor R26 has a resistance of 1 kilohm, and the feedback capacitor C3 has a capacitance of 200 microfarads.

A special advantage of the line receivers shown in FIGS. 10–12 is that only one feedback capacitor C3 is needed to bootstrap both input terminals IN+ and IN−. This is especially advantageous because it is difficult to match large capacitors largely due to the construction of the capacitors and environmental conditions. Since the feedback capacitor C3 must be quite large to achieve superior performance at audio frequencies, significant improvement is obtained by the line receivers shown in FIGS. 10–12 over the line receivers shown in FIG. 8–9 that require matched large capacitors C1 and C2.

Although the foregoing discloses preferred embodiments of the present invention, it is understood that those skilled in the art may make various changes to the preferred embodiments shown without departing from the scope of the invention. The invention is defined only by the following claims.

I claim:

1. A line receiver for receiving a differential-mode input signal from first and second differential lines and for outputting an output signal relative to a local ground reference on an output line, the line receiver comprising:

a differential amplifier having
  first and second input terminals, and
  an output terminal that connects to the output line; and
a gain-stage amplifier having
  first and second differential input terminals that directly connect to the respective first and second differential lines,
  first and second differential output terminals that connect to the respective first and second input terminals of the differential amplifier,
  first and second operational amplifiers, each having an output terminal, an inverting input terminal, and a noninverting input terminal, the noninverting input terminal of the first operational amplifier being connected to the first differential input terminal, the noninverting input terminal of the second operational amplifier being connected to the second differential input terminal, the output terminal of the first operational amplifier being connected to the first differential output terminal, and the output terminal of the second operational amplifier being connected to the second differential output terminal,
  first, second and third gain resisters, the first gain resistor connected between the output terminal and the inverting input terminal of the first operational amplifier, the second gain resistor connected between the output terminal and the inverting input terminal of the second operational amplifier, and the third gain resistor connected between the inverting input terminals of the first and second operational amplifiers,
first and second bias resistors connected in series between the first and second differential input terminals,
a third bias resistor connected between the ground terminal and the node between the first and second bias resistors, to provide a dc current path from the first and second differential input terminals to the ground terminal,
fourth and fifth bias resistors connected in series between the first and second differential output terminals,
a unity-gain amplifier having an input terminal and an output terminal, the input terminal of the unity-gain amplifier being connected to a node between the fourth and fifth bias resistors, and
a capacitor connected between the output terminal of the unity-gain amplifier and the node between the first, second and third bias resistors, the capacitor being sized to have an impedance less than the resistance of the third bias resistor at frequencies above the first predetermined frequency.

2. A line receiver as defined in claim 1, wherein the unity-gain amplifier comprises:
  a third operational amplifier having an inverting input terminal, a noninverting input terminal, and an output terminal, wherein the noninverting input terminal of the third operational amplifier is connected to the input terminal of the unity-gain amplifier and wherein the output terminal of the third operational amplifier is connected to the inverting input terminal of the third operational amplifier and to the output terminal of the unity-gain amplifier.

3. A line receiver for receiving a differential-mode input signal from first and second differential lines and for outputting an output signal relative to a local ground reference on an output line, the line receiver comprising:
  a differential amplifier having
    first and second input terminals, and
    an output terminal that connects to the output line; and
  a gain-stage amplifier having
    first and second differential input terminals that directly connect to the respective first and second differential lines,
    first and second differential output terminals that connect to the respective first and second input terminals of the differential amplifier,
    a differential-gain stage having first and second differential-gain stage input terminals and first and second output terminals, wherein the differential-mode gain of the differential-gain stage is greater than its common-mode gain, and the first and second output terminals of the differential-gain stage are coupled, respectively, to the first and second output terminals of the gain-stage amplifier, and
    a low-pass filter having first and second series elements and first and second shunt elements, the first series element providing a dc connection between the first differential input terminal and the first differential-gain stage input terminal, the second series element providing a dc connection between the second differential input terminal and the second differential-gain stage input terminal, the first shunt element having one end coupled to the first differential-gain stage input terminal and its other end coupled to the ground terminal, through a portion of the gain-stage amplifier that effectively couples the first shunt element to the ground terminal only at frequencies above a second predetermined frequency, and the second shunt element having one end coupled to the second differential-gain stage input terminal and its other end coupled to the ground terminal, through the portion of the gain-stage amplifier that effectively couples the second shunt element to the ground terminal only at frequencies above the second predetermined frequency, wherein the second predetermined frequency is higher than a first predetermined frequency so that the gain-stage amplifier provides common-mode input impedances at its first and second differential input terminals that are greater at frequencies between the first and second predetermined frequencies than at dc.

4. An audio line receiver as defined in claim 3, wherein the first predetermined frequency is approximately 0.1 hertz and the second predetermined frequency is approximately 300 kilohertz.

5. A line receiver for receiving a differential-mode input signal from first and second differential lines and for outputting an output signal relative to a local ground reference on an output line, the line receiver comprising:
  a differential amplifier having
    first and second input terminals, and
    an output terminal that connects to the output line; and
  a gain-stage amplifier having
    first and second differential input terminals that directly connect to the respective first and second differential lines,
    first and second differential output terminals that connect to the respective first and second input terminals of the differential amplifier,
    first and second operational amplifiers, each having an output terminal, an inverting input terminal, and a noninverting input terminal, the output terminal of the first operational amplifier being connected to the first differential output terminal, and the output terminal of the second operational amplifier being connected to the second differential output terminal, first and second filter elements, each having an ac impedance that is greater than or equal to its respective dc resistance, the first filter element being connected between the first differential input terminal and the noninverting input terminal of the first operational amplifier, and second filter element being connected between the second differential input terminal and the noninverting input terminal of the second operational amplifier, first, second and third gain resistors, the first gain resistor connected between the output and the inverting input of the first operational amplifier, the second gain resistor connected between the output and the inverting input of the second operational amplifier, and the third gain resistor connected between the inverting inputs of the first and second operational amplifiers, first and second bias resistors connected in series between the first and second differential input terminals, a third bias resistor connected between the ground terminal and the node between the first and second bias resistors to provide a dc current path from the first and second differential input terminals to the ground terminal, fourth and fifth bias resistors connected in series between the first and second differential output terminals, a unity-gain amplifier having an input terminal and an output terminal, the input terminal of the unity-gain amplifier being connected to a node between the fourth and fifth bias resistors, a feedback capacitor connected between the output terminal of the unity-gain amplifier and the node between the first, second and third bias resistors, the feedback capacitor being sized to have an impedance less than the resistance of the third bias resistor at frequencies above a first predetermined frequency, first and second filter capacitors connected in series between the noninverting input terminal of the first operational amplifier and the noninverting input terminal of the second operational amplifier, a filter resistor connected between the output terminal of the unity-gain amplifier and a node between the first and second filter capacitors, and a third filter capacitor connected between the node between the first and second filter capacitors and the ground terminal, the third filter capacitor being sized to have an impedance less than the resistance of the first filter resistor at frequencies above a second predetermined frequency.

6. A line receiver as defined in claim 5, wherein the first and second gain resistors each have a resistance of about 10 kilohms, the third gain resistor has a resistance of about 1 kilohm, the first and second bias resistors each have a resistance of about 10 kilohms, the third bias resistor has a resistance of about 10 kilohms, the fourth and fifth bias resistors each have a resistance of about 5 kilohms, the filter resistor has a resistance of about 1 kilohm, the feedback capacitor has a capacitance of about 200 microfarads, the first and second filter capacitors each have a capacitance of about 47 picofarads, the third filter capacitor has a capacitance of about 470 picofarads, and the first and second filter elements each have an inductance of 22 millihenries in parallel with a resistance of 47 kilohms.

7. A line receiver for receiving a differential-mode input signal from first and second differential lines and for outputting an output signal relative to a local ground reference on an output line, the line receiver comprising:

a differential amplifier having first and second input terminals and an output terminal, wherein the output terminal of the differential amplifier is connected to the output line; and an input amplifier having first and second input terminals and first and second output terminals, wherein the first and second input terminals of the input amplifier are dc connected, without any intervening series capacitors, to the respective first and second differential lines, and wherein the first and second output terminals of the input amplifier are coupled to the respective first and second input terminals of the differential amplifier;

wherein the input amplifier provides at both input terminals, a dc current path to a ground terminal sufficient to accommodate a bias current, while maintaining a high input impedance to common-mode ac signals above a first predetermined frequency, such that the common-mode input impedance of the line receiver is larger for ac signals above the first predetermined frequency than for dc signals;

wherein, above the first predetermined frequency, the line receiver receives the differential-mode input signal and substantially rejects any common-mode signals received along with the differential-mode input signal;

and wherein the input amplifier comprises first and second operational amplifiers, each having an output terminal, an inverting input terminal, and a noninverting input terminal, the noninverting input terminals of the first and second operational amplifiers being connected to the first and second input terminals, respectively, of the input amplifier and the output terminals of the first and second operational amplifiers being connected to the first and second output terminals, respectively, of the input amplifier, first, second and third gain resistors, the first gain resistor connected between the output and the inverting input of the first operational amplifier, the second gain resistor connected between the output and the inverting input of the second operational amplifier, and the third gain resistor connected between the inverting inputs of the first and second operational amplifiers, first and second bias resistors connected in series between the first and second input terminals of the input amplifier, a third bias resistor connected between the ground terminal and a node between the first and second bias resistors to provide the dc current path from the first and second input terminals of the input amplifier to the ground terminal, fourth and fifth bias resistors coupled in series between the first and second output terminals of the input amplifier, a unity-gain amplifier having an input terminal and an output terminal, the input terminal of the unity-gain amplifier being connected to a node between the fourth and fifth bias resistors, and a capacitor connected between the output terminal of the unity-gain amplifier and the node between the first, second and third bias resistors, the capacitor being sized to have an impedance less than the resistance of the third bias resistor at frequencies above the first predetermined frequency.

8. A line receiver as defined in claim 7, wherein the unity-gain amplifier comprises:

a third operational amplifier having an inverting input terminal, a noninverting input terminal, and an output terminal, wherein the noninverting input terminal of the third operational amplifier is connected to the input terminal of the unity-gain amplifier and wherein the output terminal of the third operational amplifier is connected to the inverting input terminal of the third operational amplifier and to the output terminal of the unity-gain amplifier.

9. A line receiver as defined in claim 7, wherein the first, second, and third bias resistors each have a resistance of about 10 kilohms, and the capacitor has a capacitance of about 100 microfarad so that the common-mode signals substantially rejected by the line receiver include harmonics of the a 60-hertz power-line frequency.

10. A line receiver for receiving a differential-mode input signal from first and second differential lines and for outputting an output signal relative to a local ground reference on an output line, the audio line receiver comprising:

a differential amplifier having first and second input terminals and an output terminal, wherein the output terminal of the differential amplifier is connected to the output line; and an input amplifier having first and second input terminals and first and second output terminals, wherein the first and second input terminals of the input amplifier are dc connected, without any intervening series capacitors, to the respective first and second differential lines, and wherein the first and second output terminals of the input amplifier are coupled to the respective first and second input terminals of the differential amplifier;

wherein the input amplifier provides at both input terminals, a dc current path to a ground terminal sufficient to accommodate a bias current while maintaining a high input impedance to common-mode ac signals above a first predetermined frequency, such that the common-mode input impedance of the line receiver is larger for ac signals above the first predetermined frequency than for dc signals;

wherein, above the first predetermined frequency, the line receiver receives the differential-mode input signal and substantially rejects any common-mode signals received along with the differential-mode input signal;

and wherein the input amplifier comprises first and second operational amplifiers, each having an output terminal, an inverting input terminal, and a noninverting input terminal, the noninverting input terminal of the first and second operational amplifiers being connected to the first and second input terminals, respectively, of the input amplifier and the output terminals of the first and second operational amplifiers being connected to the first and second output terminals, respectively, of the input amplifier;

first, second and third gain resistors, the first gain resistor connected between the output and the inverting input of the first operational amplifier, the second gain resistor connected between the output and the noninverting input of the second operational amplifier, and the third gain resistor connected between the inverting inputs of the first and second operational amplifiers;

first and second bias resistors connected in series between the first and second input terminals of the input amplifier;

a third bias resistor and power supply connected between the ground terminal and a node between the first and second bias resistors to provide the dc current path from the first and second input terminals of the input amplifier to the ground terminal and to provide electrical power at the first and second input terminals through the first, second, and third bias resistors;

fourth and fifth bias resistors coupled in series between the first and second output terminals of the amplifier;

a unity-gain amplifier having an input terminal and an output terminal, the input terminal of the unity-gain amplifier being connected to a node between the fourth and fifth bias resistors; and a capacitor connected between the output terminal of the unity-gain amplifier and the node between the first, second and third bias resistors, the capacitor being sized to have an impedance less than the resistance of the third bias resistor at frequencies above the first predetermined frequency.

11. A line receiver for receiving a differential-mode input signal from first and second differential lines and for outputting an output signal relative to a local ground reference on an output line, the audio line receiver comprising:

a differential amplifier having first and second input terminals and an output terminal, wherein the output terminal of the differential amplifier is connected to the output line; and an input amplifier having first and second input terminals and first and second output terminals, wherein the first and second input terminals of the input amplifier are dc connected, without any intervening series capacitors, to the respective first and second differential lines, and wherein the first and second output terminals of the input amplifier are coupled to the respective first and second input terminals of the differential amplifier;

wherein the input amplifier provides at both input terminals, a dc current path to a ground terminal sufficient to accommodate a bias current, while maintaining a high input impedance to common-mode ac signals above a first predetermined frequency, such that the common-mode input impedance of the line receiver is larger for ac signals above the first predetermined frequency than for dc signals;

wherein, above the first predetermined frequency, the line receiver receives the differential-mode input signal and substantially rejects any common-mode signals received along with the differential-mode input signal;

and wherein the input amplifier further includes first and second operational amplifiers, each having a noninverting input terminal and an output terminal, the output terminals of the first and second operational amplifiers being connected to the first and second output terminals, respectively, of the input amplifier, and a low-pass filter having first and second series elements and first and second shunt elements, the first series element providing a dc connection between the first input terminal of the input amplifier and the noninverting input terminal of the first operational amplifier, the second series element providing a dc connection between the second input terminal of the input amplifier and the noninverting input terminal of the second operational amplifier, the first shunt element having one end coupled to the noninverting input terminal of the first operational amplifier and its other end coupled to the ground terminal through a portion of the input amplifier that effectively couples the first shunt element to the ground terminal only at frequencies above a second predetermined frequency, and the second shunt element having one end coupled to the noninverting input terminal of the second operational amplifier and its other end coupled to the ground terminal through the portion of the input amplifier that effectively couples the second shunt element to the ground terminal only at frequencies above the second predetermined frequency, wherein the second predetermined frequency is higher than a first predetermined frequency so that the gain-stage amplifier provides common-mode input impedances at its first and second differential input terminals that are greater at frequencies between the first and second predetermined frequencies than at dc.

12. A line receiver as defined in claim 11, wherein the first predetermined frequency is approximately 0.1 hertz and the second predetermined frequency is approximately 300 kilohertz.

13. A line receiver for receiving a differential-mode input signal from first and second differential lines and for outputting an output signal relative to a local ground reference on an output line, the audio line receiver comprising:

a differential amplifier having first and second input terminals and an output terminal, wherein the output terminal of the differential amplifier is connected to the output line; and a gain-stage amplifier having first and second differential input terminals and first and second differential output terminals, wherein the first differential input terminal is connected to the first differential line and the second differential input terminal is connected to the second differential line and the first differential output terminal is coupled to the first input terminal of the differential amplifier, and the second differential output terminal is coupled to the second input terminal of the differential amplifier, the gain-stage amplifier including first and second operational amplifiers, each having an output terminal, an inverting input terminal, and a noninverting input terminal, the output terminal of the first operational amplifier being connected to the first differential output terminal, and the output terminal of the second operational amplifier being connected to the second differential output terminal;

first and second filter elements, each having an ac impedance that is generally greater than or equal to its respective dc resistance, the first filter element being connected between the first differential input terminal and the noninverting input terminal of the first operational amplifier, and second filter element being connected between the second differential input terminal and the noninverting input terminal of the second operational amplifier;

first, second and third gain resistors, the first gain resistor connected between the output and the inverting input of the first operational amplifier, the second gain resistor connected between the output and the inverting input of the second operational amplifier, and the third gain resistor connected between the inverting inputs of the first and second operational amplifiers;

first and second bias resistors connected in series between the first and second differential input terminals;

a third bias resistor connected between the ground terminal and the node between the first and second bias resistors to provide the dc current path from the first and second differential input terminals to the ground terminal;

fourth and fifth bias resistors connected in series between the first and second differential output terminals;

a unity-gain amplifier having an input terminal and an output terminal, the input terminal of the unity-gain amplifier being connected to a node between the fourth and fifth bias resistors;

a feedback capacitor connected between the output terminal of the unity-gain amplifier and the node between the first, second and third bias resistors, the feedback capacitor being sized to have an impedance less than the resistance of the third bias resistor at frequencies above the first predetermined frequency;

first and second filter capacitors connected in series between the noninverting input terminal of the first operational amplifier and the noninverting input terminal of the second operational amplifier;

a filter resistor connected between the output terminal of the unity-gain amplifier and a node between the first and second filter capacitors; and a third filter capacitor connected between the node between the first and second filter capacitors and the ground terminal, the third filter capacitor being sized to have an impedance less than the resistance of the first filter resistor at frequencies above the second predetermined frequency.

14. A line receiver for receiving a differential-mode input signal from first and second differential lines and for outputting an output signal relative to a local ground reference on an output line, the audio line receiver comprising:

a differential amplifier having first and second input terminals and an output terminal, wherein the output terminal of the differential amplifier is connected to the output line; and a gain-stage amplifier having first and second differential input terminals and first and second differential output terminals, wherein the first differential input terminal is coupled to the first differential line, the second differential input terminal is coupled to the second differential line, the first differential output terminal is coupled to the first input terminal of the differential amplifier, and the second differential output terminal is coupled to the second input terminal of the differential amplifier;

first and second bias resistors connected in series between the first and second differential input terminals;

third and fourth resistors connected in series between the first and second differential output terminals; and a feedback circuit that dc couples a ground terminal to a node between the first and second bias resistors to provide the input terminals of gain-stage amplifier with a dc current path to the ground terminal sufficient to accommodate a bias current and that ac couples the node between the first and second bias resistors to a node between the third and fourth resistors to maintain, at the input terminals of the gain-stage amplifier, a high input impedance to ac signals above a predetermined frequency, such that the input impedance of the line receiver is larger for ac signals above the predetermined frequency than for dc signals and such that, above the predetermined frequency, the line receiver receives the differential-mode input signal and substantially rejects any common-mode signals on the differential lines along with the differential-mode input signal.

15. A line receiver as defined in claim 14, wherein the feedback circuit comprises:

a fifth resistor coupled between the ground terminal and the node between the first and second bias resistors;

a feedback amplifier having an input terminal and an output terminal, the input terminal of the feedback amplifier being connected to a node between the third and fourth resistors;

a capacitor connected between the output terminal of the feedback amplifier and the node between the first, second and fifth bias resistors, the capacitor being sized to have an impedance less than the resistance of the fifth bias resistor at frequencies above the predetermined frequency.

16. A line receiver as defined in claim 15, wherein the feedback amplifier is a unity-gain amplifier.

17. A line receiver as defined in claim 15, wherein:

the feedback circuit further comprises a dc power supply connected in series with the fifth resistor, and the dc power supply and the fifth resistor are connected between the ground terminal and the node between the first and second bias resistors.

18. A line receiver as defined in claim 15, wherein the gain-stage amplifier further includes:

a differential-gain stage circuit having first and second differential-gain stage input terminals and first and second output terminals, wherein the differential-mode gain of the differential-gain stage circuit is greater than its common-mode gain, and the first and second output terminals of the differential-gain stage circuit are coupled, respectively, to the first and second output terminals of the gain-stage amplifier, and a low-pass filter having first and second series elements and first and second shunt elements, the first series element being coupled between the first differential input terminal and the first differential-gain gain stage input terminal, the second series element being coupled between the second differential input terminal and the second differential-gain stage input terminal, the first shunt element having one end coupled to the first differential-gain stage input terminal and its other end coupled to the ground terminal through a portion of the gain-stage amplifier that effectively couples the shunt elements to the ground terminal only at frequencies above the second predetermined frequency, and the second shunt element having one end coupled to the second differential-gain stage input terminal and its other end coupled to the ground terminal through the portion of the gain-stage amplifier that effectively couples the shunt elements to the ground terminal only at frequencies above the second predetermined frequency, wherein the second predetermined frequency is higher than the first predetermined frequency so that the line receiver receives the differential-mode signal at frequencies between the first and second predetermined frequencies and substantially rejects undesired signals having a frequency above the second predetermined frequency.

19. A line receiver as defined in claim 14, wherein the dc current path provided by the gain-stage amplifier maintains the high impedance only for common-mode ac signals.

* * * * *